United States Patent

Nelson

[19]

[11] Patent Number: 6,081,006
[45] Date of Patent: Jun. 27, 2000

[54] REDUCED SIZE FIELD EFFECT TRANSISTOR

[75] Inventor: Stephen R. Nelson, Richardson, Tex.

[73] Assignee: Cisco Systems, Inc., San Jose, Calif.

[21] Appl. No.: 09/134,291

[22] Filed: Aug. 13, 1998

[51] Int. Cl.[7] .................................................. H01L 29/772
[52] U.S. Cl. .......................... 257/276; 257/522; 257/728
[58] Field of Search ..................................... 257/276, 522, 257/728

[56] References Cited

U.S. PATENT DOCUMENTS

| | | |
|---|---|---|
| 3,969,745 | 7/1976 | Blocker, III . |
| 4,549,197 | 10/1985 | Brehm et al. . |
| 4,587,541 | 5/1986 | Dalman et al. . |
| 4,683,443 | 7/1987 | Young et al. . |
| 4,734,751 | 3/1988 | Hwang et al. . |
| 4,785,202 | 11/1988 | Toyoda . |
| 4,833,095 | 5/1989 | Calviello . |
| 4,853,649 | 8/1989 | Seino et al. . |
| 4,896,194 | 1/1990 | Suzuki . |
| 4,921,814 | 5/1990 | Ishikawa et al. . |
| 4,959,705 | 9/1990 | Lemnios et al. ......................... 257/276 |
| 4,974,039 | 11/1990 | Schindler et al. . |
| 4,992,764 | 2/1991 | Ayasli ....................................... 257/276 |
| 5,023,677 | 6/1991 | Truitt ........................................ 257/276 |
| 5,025,296 | 6/1991 | Fullerton et al. ........................ 257/276 |
| 5,160,984 | 11/1992 | Mochizuki et al. . |
| 5,162,258 | 11/1992 | Lemnios et al. . |
| 5,185,534 | 2/1993 | Sakamoto et al. . |
| 5,208,726 | 5/1993 | Apel . |
| 5,227,738 | 7/1993 | Shiga . |
| 5,233,313 | 8/1993 | Kohno et al. . |
| 5,267,020 | 11/1993 | Marsland et al. . |
| 5,274,256 | 12/1993 | Shiga . |
| 5,283,452 | 2/1994 | Shih et al. . |
| 5,287,072 | 2/1994 | Kojima et al. . |
| 5,324,981 | 6/1994 | Kobiki et al. . |
| 5,343,172 | 8/1994 | Utsu et al. . |
| 5,351,163 | 9/1994 | Dawson et al. . |
| 5,381,157 | 1/1995 | Shiga . |
| 5,386,130 | 1/1995 | Gamand et al. . |
| 5,614,743 | 3/1997 | Mochizuki . |
| 5,633,517 | 5/1997 | Saitoh . |
| 5,689,138 | 11/1997 | Dekker et al. . |

*Primary Examiner*—David Hardy
*Attorney, Agent, or Firm*—Baker Botts L.L.P.

[57] ABSTRACT

A reduced size field effect transistor is disclosed which has a substrate with a body of semiconductor material having an active region on one surface thereof, and a common conductor located in remote insulated relation to the one surface of the semiconductor body, a pair of source electrodes, a drain electrode and a gate electrode located on the one surface, with the drain electrode having drain fingers located on opposite sides of each of the source electrodes and an air bridge overlying the source electrodes and interconnecting the drain fingers located on opposite sides of each of the source electrodes, the gate electrode having a connection pad at one side thereof and a manifold extending between the source electrodes, and having gate fingers extending between the drain fingers and the source electrodes, and conductive connections between the source electrodes and the common conductor.

31 Claims, 8 Drawing Sheets

REDUCED SIZE FIELD EFFECT TRANSISTOR

The present invention generally relates planar structures having multiple electrode elements on an active surface thereof for making electronic components such as field effect transistors. More particularly, the present invention generally relates to an improved reduced size Gallium Arsenide (GaAs) Metal-Schottky Field Effect Transistor (MESFET, or FET).

It is known that Gallium Arsenide Field Effect Transistors, pseudomorphic high electron mobility transistors (pHEMT) and similar FET-related transistors (MODFET, SAGFET, MISFET, etc.) layouts have become fairly standardized over the past 20 years. One typical standard FET layout used in monolithic microwave integrated circuits (MMICs) comprises an interdigitated or parallel finger gate finger layout that has a pair of outer source electrodes with interdigitated gate, source and drain fingers located between the two outer source electrodes with each outer source having a VIA hole therein for providing a conductive connection to a ground plane on the opposite side of the structure. In such typical interdigitated FET layouts where the gate fingers form Schottky contacts to channels between source and drain fingers, the gate length is in the direction of current flow across the channel with the gate width representing the longer dimension of the fingers. The total gate width in such structures is calculated by multiplying the FET gate fingers times the width of each FET gate finger. Thus, if there were 20 gate fingers with each having a 50 micron width, then there would be a total gate width of 1000 microns for the FET.

These traditional layouts require significant amounts of area for providing the VIA ground connection, particularly when the FETs are placed in parallel. In this regard, it is common to place FETs in parallel to increase the amplifier DC or radio frequency, microwave, millimeter-wave current and to increase the output power. As more of these FETs are placed in parallel, the overall structure can become quite large. Typically, the last stage FET of a MMIC amplifier dictates the overall width of the MMIC and therefore its size.

Such standard FETs are normally fabricated on GaAs substrates which have thicknesses that range from roughly 25 microns to as much as 750 microns for FETs that do not have VIAs. For thicknesses of 100 microns or greater, it is difficult to etch small VIA openings in the substrate and to reduce the size of the VIAs to any significant degree that would enable the overall footprint for the conventional FETs to be significantly reduced.

Accordingly, it is an object of the present invention to provide an improved FET layout topology that takes advantage of thinner substrates and smaller VIAs.

Another object of the present invention is to provide such an improved FET layout topology which utilizes a very thin GaAs substrate, i.e., less than about 75 micron thickness, which facilitates processing of smaller area VIAs. A concomitant advantage is a reduction in the inductance which thereby enables a higher upper useful operating frequency capability for the FET.

Still another object of the present invention lies in the provision for an improved FET layout which enables efficient parallel placement of an array of multiple FET cells, which enables a reduced overall size for a plurality or array of FET cells in a multiple cell FET layout for an integrated circuit.

A related object is to provide such an improved reduced size FET layout that results in reduced cost per FET cell while providing comparable output power.

Yet another object of the present invention is to provide such an improved reduced size FET layout that results in lower operating temperatures compared to the standard prior art interdigitated FET layouts which thereby improve the reliability of such FETs.

Still another object of the present invention is to provide such an improved layout topography that enables the use of simpler designed gate and drain network feeds because of the close proximity of the gate and drain feed pads for the present invention.

A related object of the present invention lies in the provision of reduced feed network inductance and concomitant increase in upper frequency range of operation.

Still another object of the present invention lies in the provision for improved amplitude and phase combining of parallel FET cells in an array of such cells.

Yet another advantage of the present invention lies in the provision for having efficient gate and drain series and shunt feed networks that can be placed very close to the FET cell, which is possible because of the absence of large ground pads which in prior art configurations were required to be avoided.

Another object lies in the provision for providing an improved FET layout topology which enables shunt or parallel feedback to be easily implemented over a very short path length. This will enable circuit designers to implement novel feedback amplifier design approaches at very high frequencies of 100 GHz or more.

Yet another object of the present invention is to provide an improved FET layout topology that enables designers to easily implement shunt gate or shunt drain capacitors to ground using the FET VIA grounds. This offers new low inductance matching network possibilities to circuit designers.

Still another object of the present invention is to provide an improved FET layout which is source balanced, i.e., each FET channel sees the same source inductance to ground, which is important in insuring stability of operation of the FETs, particularly for those operating at microwave or millimeter wave frequencies.

Other objects and advantages will become apparent upon reading the following detailed description, while referring to the attached drawings, in which.

DETAILED DESCRIPTION

Broadly stated, the present invention relates to an improved FET layout topology which results in a FET cell structure which has many advantages compared to many existing prior art FET structures. The FETs are less costly to manufacture and are smaller than conventional designs on a cell by cell basis, which because of the unique FET cell design are adapted to be formed as an array of FET cells to be formed on a common substrate in an efficient manner. The FET cell design also contributes to ease of design of gate and drain network feeds that have short path lengths and other advantages. The FET is source-balanced, offering good stability at high frequencies.

Figure 1:
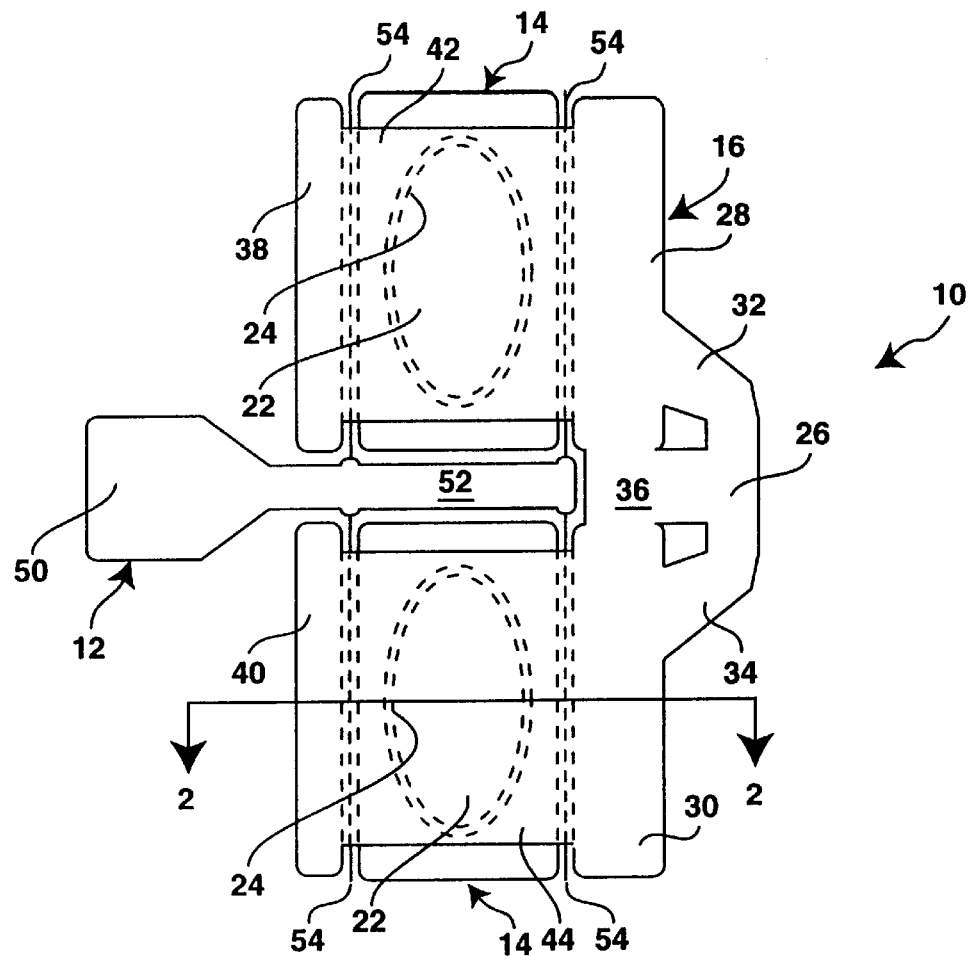
FIG. 1 is a plan view of a single cell FET made in accordance with the present invention.
Figure 2:
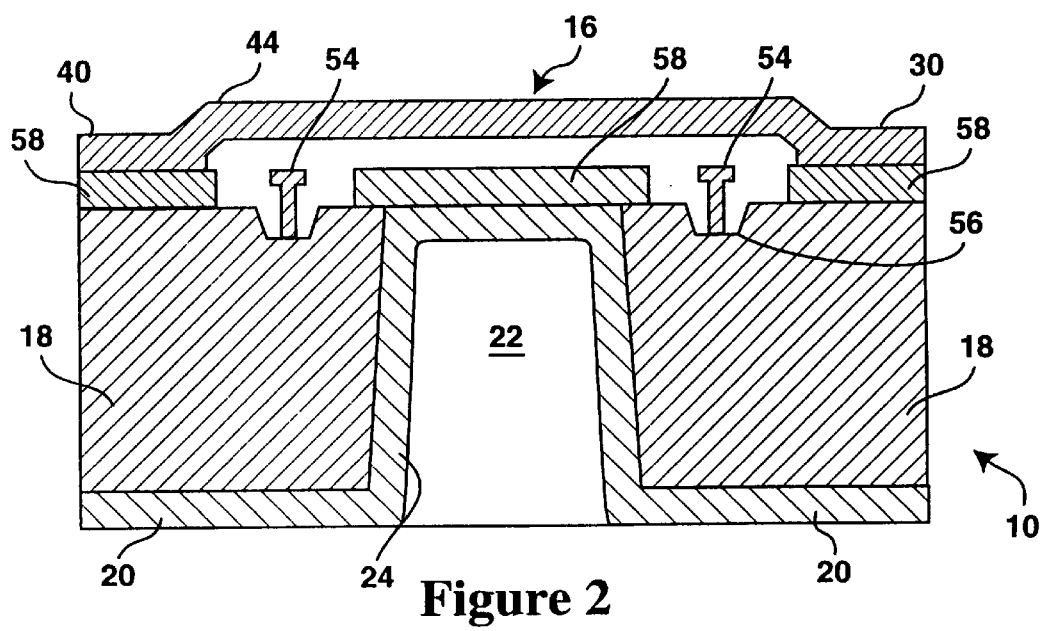
FIG. 2 is a cross section taken generally along the line 2—2 of FIG. 1.

Turning now to the drawings, and particularly FIG. 1, a single FET cell is shown in plan view in FIG. 1 and in cross section in FIG. 2. The cell indicated generally at 10 has a gate electrode, indicated generally at 12, a pair of source electrodes 14 and a drain electrode, indicated generally at 16. The electrodes 12, 14 and 16 are formed on a GaAs substrate 18 which has a common ground plane conducting layer 20 formed on the bottom surface. It should also be understood that the substrate 18 may be made of Indium Phosphide, which may result in higher operating frequencies for the FET. The thickness of the substrate 18 is preferably much less than conventional prior art substrates and preferably is within the range of about 20 microns to about 60 microns, although the thickness can be as large as 100 microns. The thickness of the conducting layer 20 is preferably in the range of 1 to about 3 microns, but can be as much as 25 microns. Each of the source electrodes 14 is electrically connected to the conducting layer 20 by means of an opening or VIA 22 which has a metallic or other conducting layer 24 that extends from the source to the conducting layer 20. The VIAs are preferably made by using a gas plasma etching process which is done from the bottom through to the top and the conductive layer 24 is preferably sputtered to the sidewalls of the VIA opening 22 in the substrate 18 and also to form the conductive layer 20. It should be understood that the conductive layer 20 does not span the areas of the VIAs 22, but is connected to them by virtue of having been preferably formed at the same time.

Figure 4:
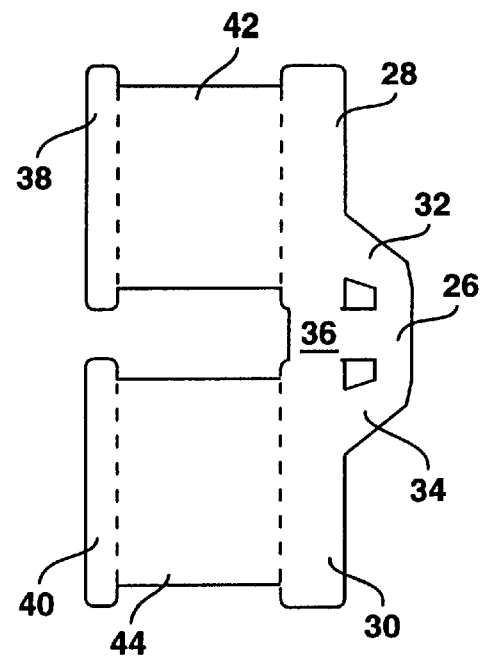
FIG. 4 is a plan view of the drain electrode of the FET shown in FIG. 1.
Figure 5:
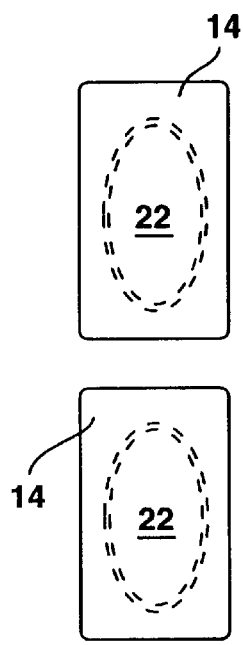
FIG. 5 is a plan view of the source electrodes and illustrating the VIA opening in the same.

Turning now to the construction of the drain electrode 16 and referring to FIG. 4, it comprises a drain pad 26 which comprises the drain feed. The drain electrode 16 also has a pair of drain fingers 28 and 30 that are connected to the drain pad 26 by air bridge portions 32, 34 and 36. Another pair of drain fingers 38 and 40 are connected to the drain fingers 28 and 30, respectively, by air bridge portions 42 and 44. The air bridge portion 36 is connected to drain fingers 28, 30 and drain pad 26. The air bridge portion 36 reduces the capacitance as well as inductance. The air bridge portion 36 is preferably present to provide an additional current path from the drain pad 26 to the drain fingers 28 and 30, and it helps to stabilize the FET at high frequencies. The angled portions 32 and 34 are also air bridge portions to facilitate lifting off of metal during fabrication which is conducive to providing improved yields during production. It also lessens the occurrence of parasitic capacitance from drain to ground. As shown in FIG. 2, the bridge portions 42 are higher in elevation relative to the drain fingers 30 and 40 so that there is a space between them and the source electrode 14.

Figure 3:
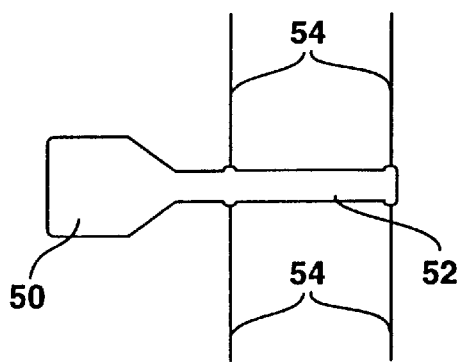
FIG. 3 is a plan view of the gate electrode construction that is utilized in the FET of FIG. 1.

With respect to the gate electrode 12, and referring to FIG. 3, it has a gate pad 50 that is integrally formed with a manifold portion 52, with gate fingers 54 extending from the manifold 52. As shown in FIG. 2, the fingers are preferably generally T-shaped in cross section, but may be rectangular or triangular shaped, and are formed on the GaAs in a small etched recess 56. The gate fingers shown in FIGS. 1 and 3 can have widths varying from 5 microns to greater than 100 microns. Typical gate finger widths would be between 25 and 75 microns. (It should be understood that the longer dimension of the gate fingers is described as the width in the art of FETs, and the bottom of the T shaped finger 54 shown in FIG. 2 is referred to as its length, and is shown to be about 0.25 microns.)

The drain fingers 30 and 40 are formed on a layer 58 that is an ohmic metal that is alloyed to the GaAs layer 18 and provides a surface on which the fingers 30 and 40 can be formed. The electrodes are preferably made of gold and it is known that gold does not bond directly to GaAs.

Figure 6:
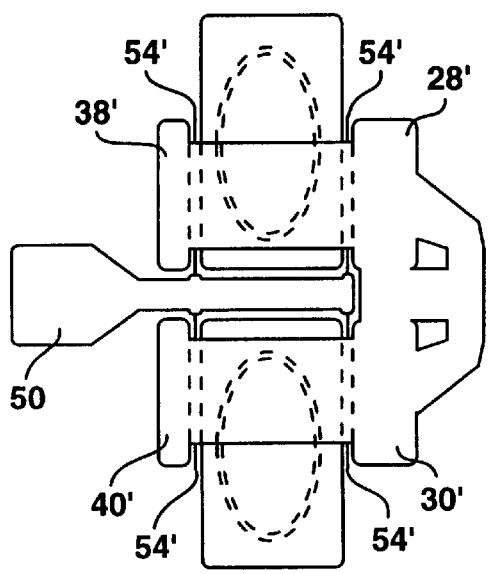
FIG. 6 is a plan view of an alternative embodiment of the present invention, and illustrating a FET having a reduced gate width.

In accordance with an important aspect of the present invention, the FET cells can be modified to achieve different operating characteristics and frequencies. For example, in FIG. 6, the length of the gate fingers 54' are shortened as are the length of the drain fingers 28', 30', 38' and 40'. Such a construction exhibits lower noise during operation because the shorter gate fingers have less gate resistance. (The use of prime (') and double prime (") designators is intended to identify the same component that was described in connection with the single FET cell shown in FIGS. 1–5, recognizing that there may be slight modifications to accommodate the particular combination shown in FIGS. 6 through 9.)

Figure 7:
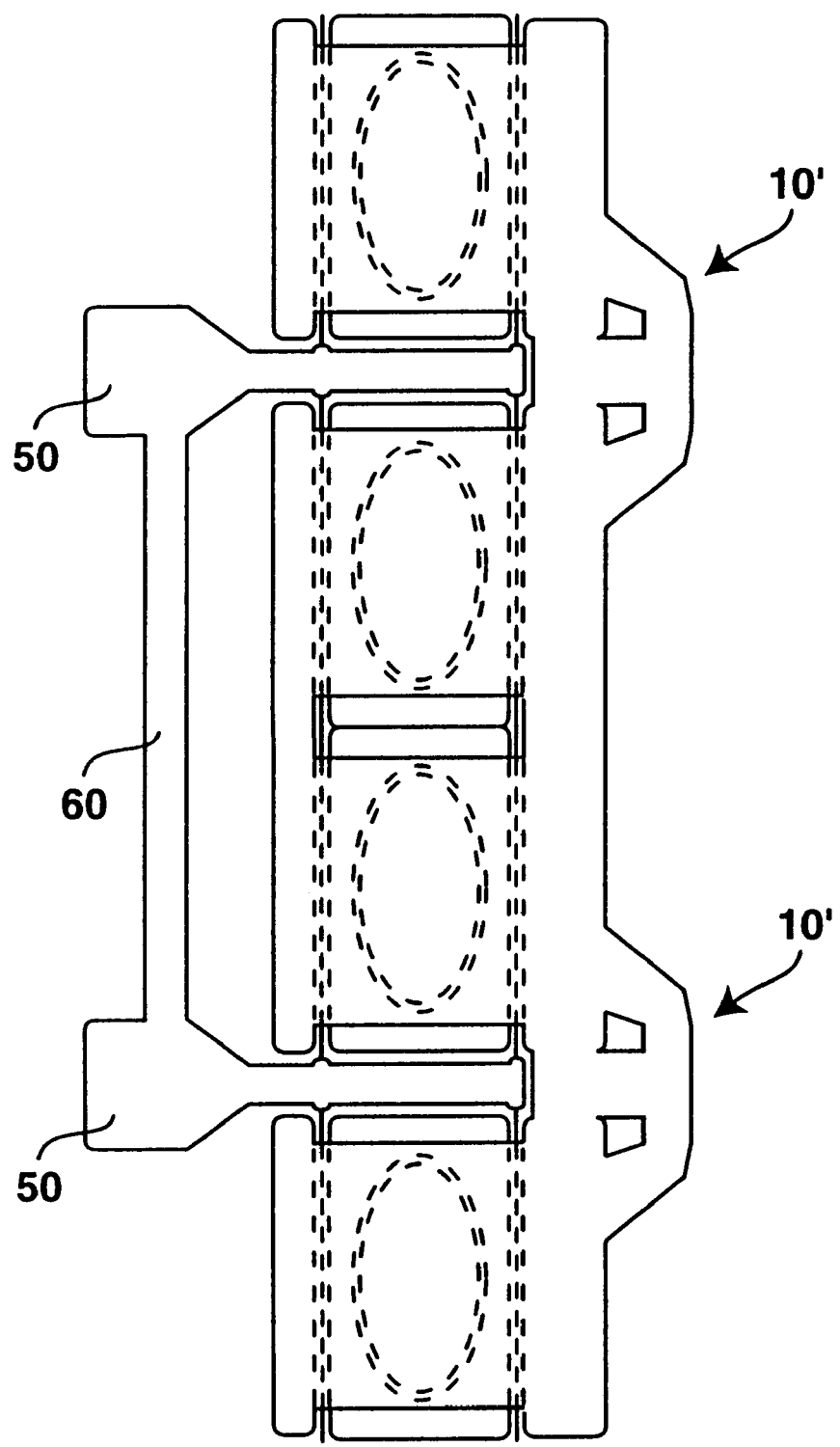
FIG. 7 is a plan view of two FET cells in parallel that are formed on a common substrate, with the cells being connected in the "vertical" direction as depicted in the drawing.
Figure 7A:
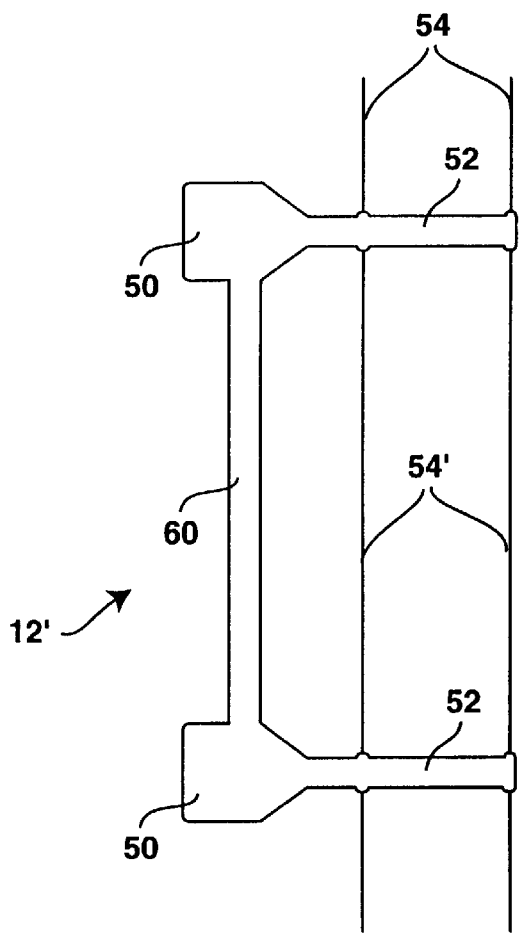
FIG. 7a is a plan view of the gate electrodes for the embodiment shown in FIG. 7.
Figure 7B:
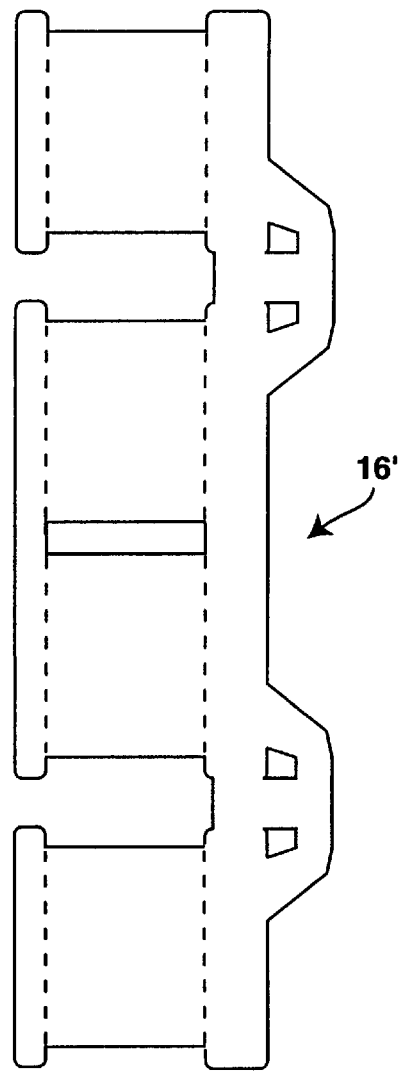
FIG. 7b is a plan view of the drain electrode for the embodiment shown in FIG. 7.
Figure 8:
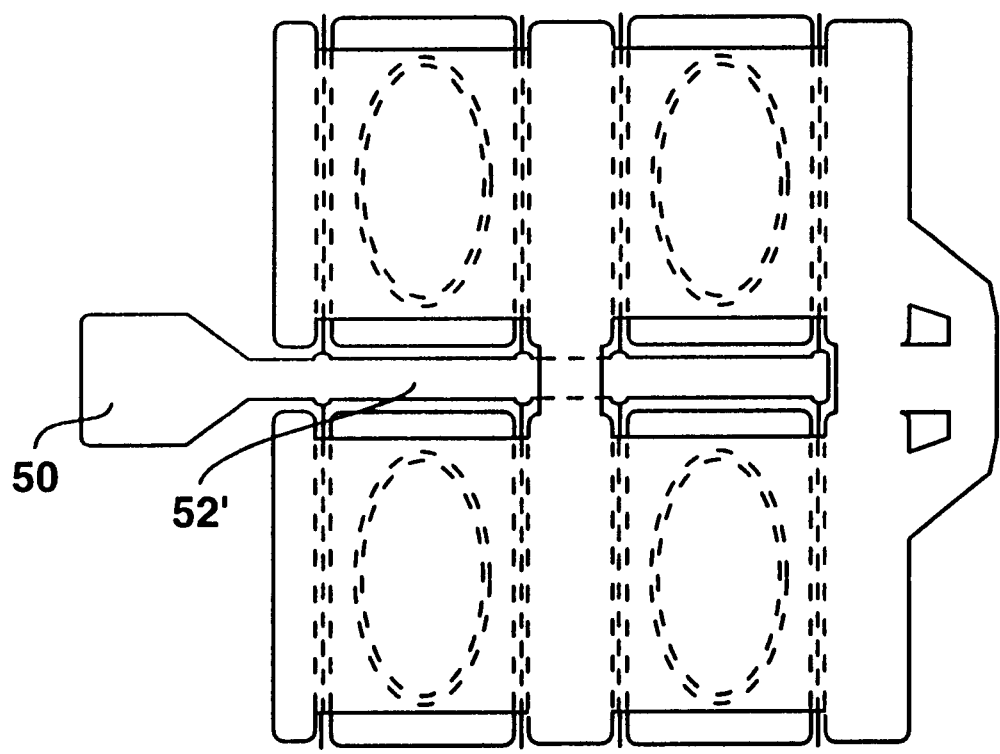
FIG. 8 is a plan view of a pair of FET cells that are connected in the "horizontal" direction as depicted in the drawing.
Figure 8A:
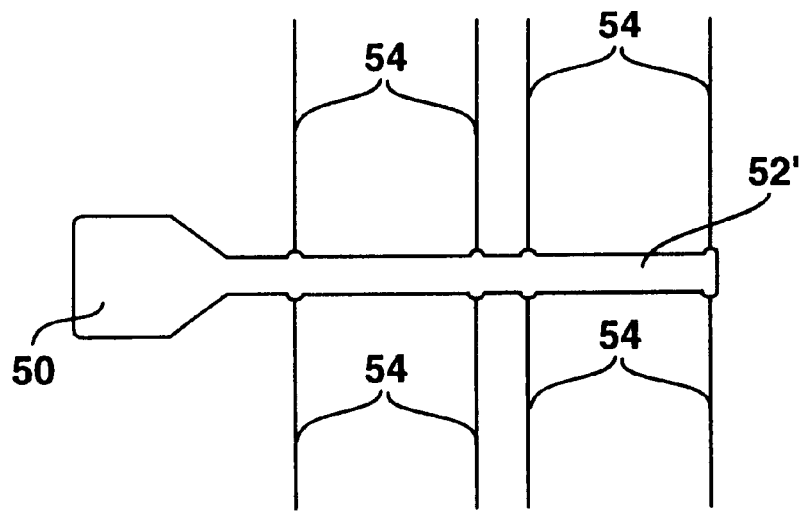
FIG. 8a is a plan view of the gate electrodes of the embodiment shown in FIG. 8.
Figure 8B:
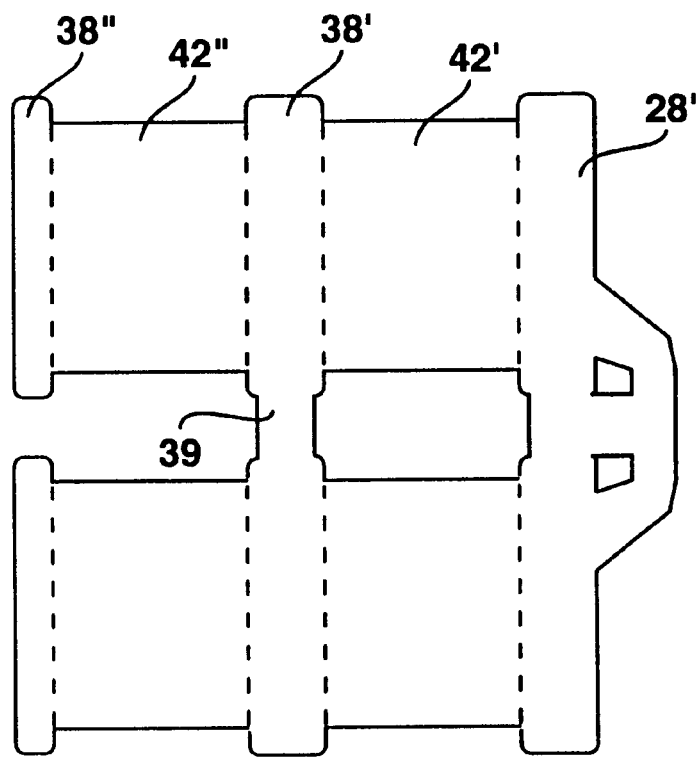
FIG. 8b is a plan view of the drain electrode for the embodiment shown in FIG. 8.
Figure 9:
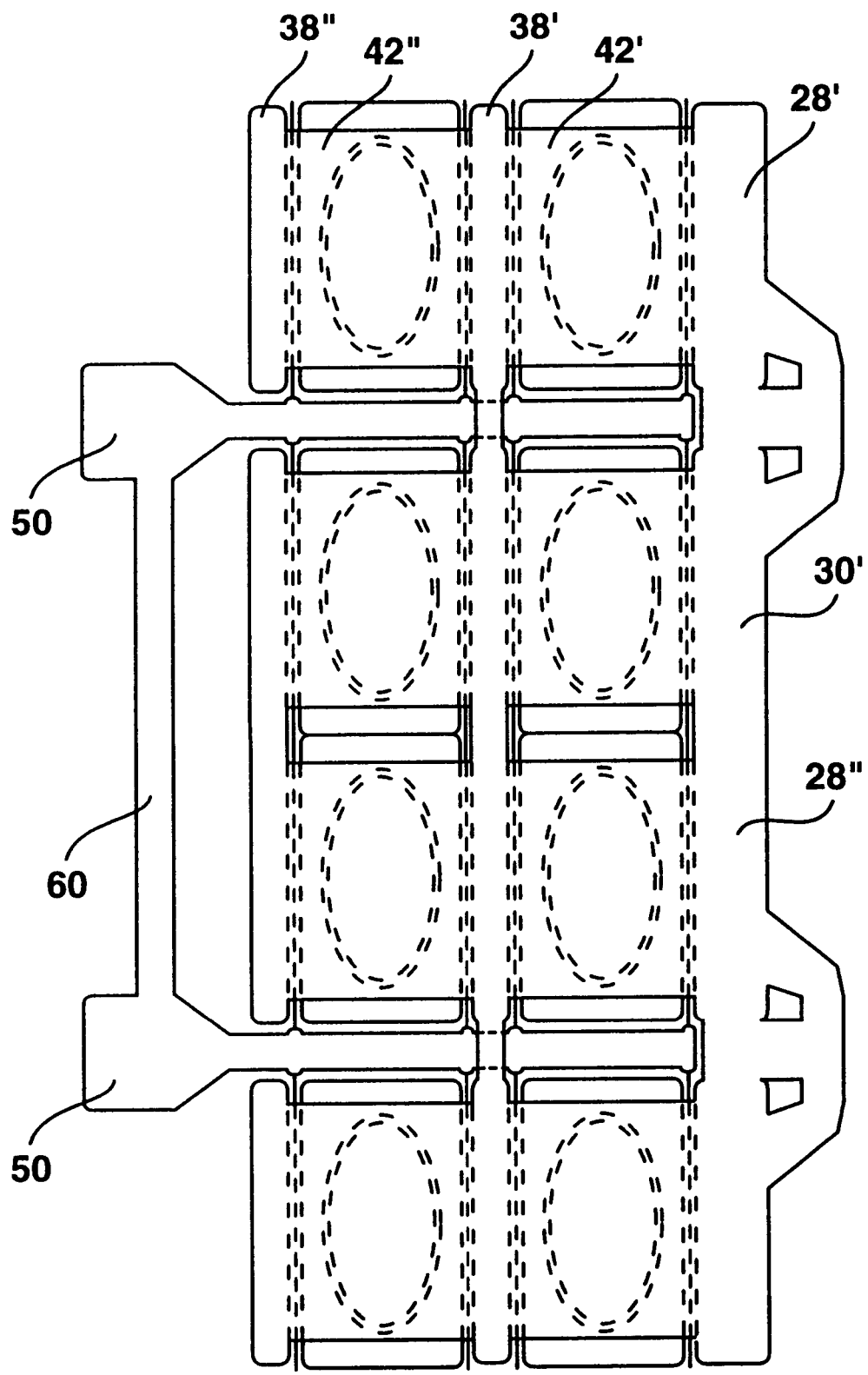
FIG. 9 is a plan view of four FET cells that are connected in parallel with two cells being connected in the "vertical" direction and the "horizontal" direction as depicted in the drawing.
Figure 9A:
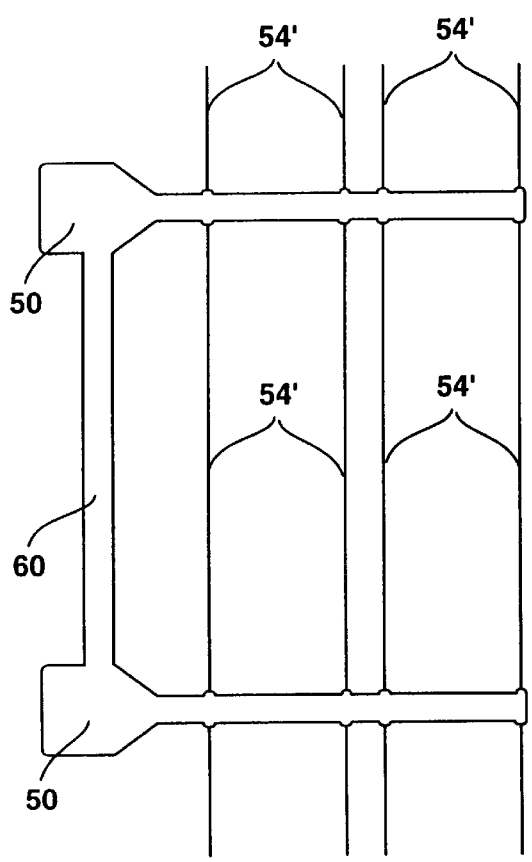
FIG. 9a is a plan view of the gate electrode for the embodiment shown in FIG. 9.
Figure 9B:
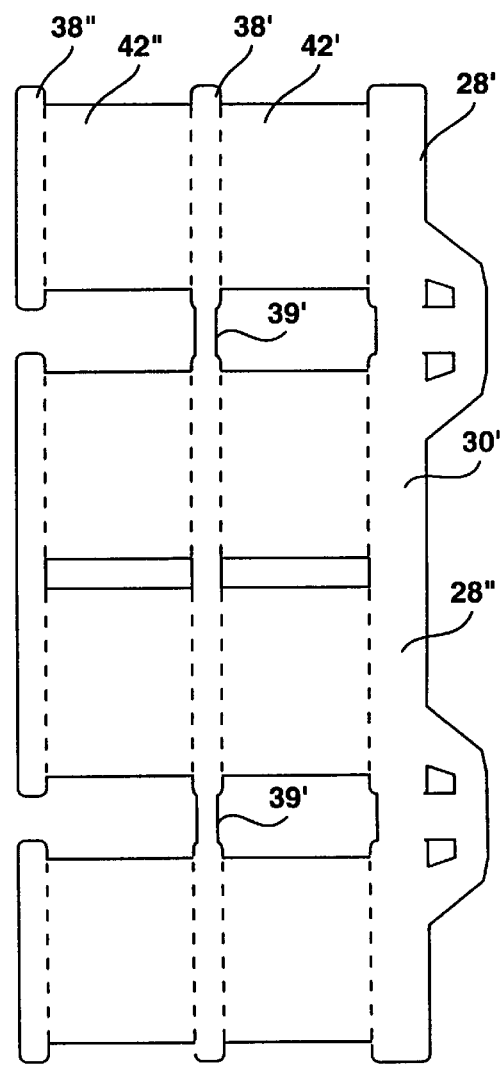
FIG. 9b is a plan view of the drain electrode for the embodiment shown in FIG. 9.

In accordance with another important aspect of the present invention, FET cells can be combined to form an array of FET cells as shown in FIGS. 7, 8 and 9, for example. While FIGS. 7 and 8 illustrate two FET cells that are combined, FIG. 9 illustrates an array of four FET cells. Moreover, it should be understood that a significantly larger number of cells can be combined either in the horizontal direction as shown in FIGS. 7, 8 and 9 or in the vertical direction. With such combinations, the construction of the corresponding gate electrode for such combinations are shown in FIGS. 7a, 8a and 9a, whereas the corresponding drain electrodes are shown in FIGS. 7b, 8b and 9b.

Referring to the array shown in FIG. 7, there are two FET cells 10' that are formed in this array, with each cell being substantially the construction as shown in FIG. 1, with the gate fingers being vertically oriented in two rows or stripes. A connection 60 is provided between the gate pads 50' of adjacent FET cells 10' to provide a low impedance connection between the cells which minimizes undesirable FET oscillation. It is also preferred that a substantial portion of the connection 60 be an air bridge to reduce gate-drain parasitic capacitance, with the connection having a single post provided preferably located midlength along the connection. The connection 60 shown in FIG. 9a is similarly constructed. The gate fingers of adjacent cells are connected to one another at their ends as is more clearly illustrated in FIG. 7a. Such connection of gate fingers from adjacent cells also reduces the undesirable parallel FET oscillation.

For an array of two cells that are connected in the horizontal direction such as illustrated in FIG. 8, the gate manifold 52' is extended in the horizontal direction and the gate fingers of the next cell extend from the longer manifold 52' as shown in FIG. 8a. Also in this array, the drain electrode has drain fingers 28' and 38' that are interconnected by an air bridge portion 42' and another bridge portion 42'' interconnects the drain finger 38' to drain finger 38''. Also, the drain finger 30' is integrally formed with a drain finger 28'' which is part of the adjacent cell. The connecting portion 39 shown in FIG. 8b is preferably an air bridge portion, as are portions 39' shown in FIG. 9b.

The ability to stack cells in either the horizontal direction as well as the vertical direction is facilitated because of the compact and simple design of each of the FET cells. As known to those of ordinary skill in the art, if operation of the FET is intended to be at a higher power at a higher frequency, then the vertical stacking as shown in FIG. 7 will be utilized. Generally, the lower the intended frequency of operation for a MMIC, the stacking will be longer in the horizontal direction. If it is intended to operate such an amplifier at higher frequencies, then the stacking will be done more in the vertical direction.

From the foregoing description of the structure of the individual FET cells and a few of the many possible arrays of such FET cells, it should be understood that the FET cell layout topology makes use of small area VIAs 22 which are typically about 50 microns or smaller in the narrow dimension at the top or active surface of the FET cells. While GaAs processing may permit small area VIAs 22 to be processed on thicker substrates in the future, the reduced thickness substrates are preferred at the present time. While the combinations shown in FIGS. 7, 8 and 9 are comprised of either two or four FET cells, it should be understood that arrays may be formed where three or more cells may be formed in the horizontal direction and eight or more cells in the vertical direction.

As with all of the illustrated arrays and the arrays just mentioned, the individual FET cells have a generally uniform construction and an advantage lies in the fact that the path length between the gate fingers and the drain fingers is extremely small and uniform. This means that the phase difference from gate to gate in an array will be minimized, which is unlike the prior art interdigitated topology. Also, the reduced size FET cell layout results in the gate channels normally operating at a lower temperature than for standard interdigitated FET layouts, because the gate channel heat sources are effectively spread further apart than for the interdigitated FET layout. Also, the VIA grounds or ground conducting layer 20 also help to remove heat from the FET channels. The lower channel temperature improves FET reliability and performance.

It should also be evident that the FET cell topology of the present invention facilitates simpler gate and drain network feed design, since the gate and drain feed points are closer together than before the prior art structure such as interdigitated FET structures. Moreover, the feed networking inductance is reduced by the present invention, thereby increasing the upper frequency range of operation. The present invention also offers improved amplitude and phase combining of parallel FET cells, compared to large gate width interdigitated FET structures. The path lengths from gate to drain are significantly shorter in the present invention, particularly for those FETs with gate widths in the 500 to 1000 micron range. Such improvements in amplitude and phase combining of parallel FET cells results in higher output power, gain, power-added efficiency and linearity in performance.

The FET cell design topology embodying the present invention also allows gate and drain series and shunt feed networks to be placed very close to the FET cell. There are no large VIA ground pads to avoid in laying out feed lines as was typical in the past. Also, the present invention enables shunt or parallel feedback to be easily implemented from drain to gate over a very short path length even at millimeter wave frequencies. The input gate feeds and drain fingers for the new FET cell design are within about 12 microns of one another. This will permit circuit designers to implement novel feedback amplifier design approaches at very high frequencies of 100 GHz or more. The present invention will also permit designers to build shunt gate or shunt drain capacitors to ground using the FET VIA 22 grounds which will offer low inductance matching network possibilities for circuit designers.

The present invention FET cell layout arrays are also source balanced in the sense that each FET channel sees the same source inductance to ground which is important in insuring stability of the FET or of amplifiers which operate at microwave or millimeter wave frequencies. In this regard, it should be understood from the foregoing description of the various embodiments of the present invention, that there must be an even number of gate fingers or stripes, with one located on each side of each VIA. This layout provides the required source balance for proper operation. If an uneven number of gate fingers are present, the FET will oscillate.

The layouts of the present invention make effective use of air bridge metal interconnects for connecting drain fingers together as well as connecting gate feeds and gate fingers together. Gaps are preferably placed along gate drain feed lines and connected by air bridges to facilitate simple metal lift off processing thereby increasing the processing yields. The air bridges are also used to decrease FET parasitic gate and drain capacitances to ground and to decrease gate to drain capacitance of the FET. This increases FET reverse isolation and improves its stability. The new reduced size FET cell topology minimizes FET parasitic capacitances.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A field effect transistor comprising:
   substrate means including a body of semiconductor material having an active region on one surface thereof, and including a common conductor located in remote insulated relation to said one surface of said semiconductor body;
   a pair of source electrodes, a drain electrode and a gate electrode located on said one surface;
   said drain electrode having drain finger portions located on opposite sides of each of said source electrodes and an air bridge portion overlying said source electrodes and interconnecting said drain finger portions located on opposite sides of each of said source electrodes;
   said gate electrode having a connection pad at one side thereof and a manifold extending between said source electrodes, and having gate finger portions extending between said drain electrode drain finger portions and said source electrodes; and,
   at least one conductive connection between said source electrodes and said common conductor.

2. A field effect transistor as defined in claim 1 wherein said substrate means comprises a Gallium Arsenide substrate layer having at least one opening extending from each of said source electrodes and to said common conductor, said conductive connection extending from said source electrode to said common conductor through each said opening.

3. A field effect transistor as defined in claim 2 wherein said openings have a predetermined size and said conductive connection comprises a conductive material adhering to the side wall of said opening.

4. A field effect transistor as defined in claim 3 wherein said openings are generally oval shaped and said conductive material has a thickness substantially less than the diameter of said opening.

5. A field effect transistor as defined in claim 4 wherein the thickness of said conductive material is within the range of about 2 microns to about 25 microns.

6. A field effect transistor as defined in claim 1 wherein said substrate has a thickness within the range of about 25 microns to about 75 microns.

7. A field effect transistor as defined in claim 1 wherein said common conductor has a thickness of about 2 to about 25 microns.

8. A field effect transistor as defined in claim 1 wherein said gate electrode comprises an elongated manifold portion extending in a first direction and a connection pad at one end thereof, said elongated manifold portion having at least two finger portions spaced apart from one another on opposite sides of said source electrode and extending outwardly from said elongated manifold portion in a second direction generally orthogonally relative to said first direction, said gate electrode being in electrically nonconducting relation with said source electrode.

9. A field effect transistor as defined in claim 8 wherein said finger portions have a T shaped cross section.

10. A field effect transistor as defined in claim 8 wherein said source electrode is elongated in said second direction and extends on opposite sides of said gate electrode, said substrate means having at least one opening in registration with said source electrode and extending to said common conductor, said conductive connection extending from said source electrode to said common conductor through each said opening, said drain electrode having a portion located on opposite sides of said source electrode, each portion of which extends generally coextensively with an end of said source electrode, one of said gate fingers being located between each of said drain portions and said source electrode.

11. A field effect transistor as defined in claim 10 wherein said drain electrode includes a connection pad located generally on the opposite side of said transistor relative to said gate electrode connection pad.

12. A field effect transistor as defined in claim 1 wherein said substrate means comprises a Indium Phosphide substrate layer having at least one opening extending from each of said source electrodes and to said common conductor, said conductive connection extending from said source electrode to said common conductor through each said opening.

13. A field effect transistor comprising:
   substrate means including a body of semiconductor material having an active region on one surface thereof, and including a common conductor located in remote insulated relation to said one surface of said semiconductor body;
   a gate electrode located on said one surface having a gate pad located at a first side of said one surface, a manifold portion extending generally between said pair of source electrodes and gate finger portions extending from said manifold portion on opposite sides of each of said source electrodes between said source electrodes and said drain electrode;
   a pair of source electrodes located on said one surface, each having a generally flat rectangular shape with its length being generally parallel to the direction of said gate finger portions, and having a relatively large opening therein, at least one conductive connection between each of said source electrodes and said common conductor; and,
   a drain electrode located on said one surface and having a drain pad portion located at a second side of said one surface generally opposite said first side and between said pair of source electrodes, a first extension portion located adjacent to each of said source electrodes and also to adjacent gate finger portions and extending away from said drain pad portion a distance generally coextensive with the length of adjacent gate finger portions, a second extension portion located adjacent to each of said source electrodes and also to adjacent gate finger portions on opposite sides of said source electrodes from said first extension portion, said second extension portion being generally coextensive with said first extension portion and an air bridge portion extending from said first extension portion to said second extension portion.

14. A field effect transistor as defined in claim 13 wherein said air bridge portion is out of contact with said source electrode but substantially overlies said gate finger portions.

15. A field effect transistor as defined in claim 14 wherein said gate finger portions extend from said manifold portion to a predetermined location relative to the length of each of said source electrodes.

16. A field effect transistor as defined in claim 15 wherein said predetermined location is generally coextensive with the full length of each of said source electrodes.

17. A field effect transistor as defined in claim 15 wherein said predetermined location is generally about one half of the full length of each of said source electrodes.

18. A field effect transistor as defined in claim 13 wherein said opening is generally oval shaped and said substrate means includes a generally same sized and shaped coextensive opening extending therethrough, said source electrode being electrically connected by a layer of conductive material being located on the side walls of said source electrode opening and said substrate opening and extending to said common conductor.

19. An array of cells of field effect transistors comprising:
   substrate means including a body of semiconductor material having an active region on one surface thereof, and including a common conductor located in remote insulated relation to said one surface of said semiconductor body;
   at least two cells being provided on said substrate means, each of said cells comprising:
     a pair of source electrodes located on said one surface, each of said source electrodes being conductively connected to said common conductor;
     a drain electrode located on said one surface, with a portion of said drain electrode being located on opposite sides of one of said source electrodes;
     a gate electrode located on said one surface, with a finger portion of said gate electrode being interposed between said source electrode and said drain electrode;

a first conductive connection interconnecting said drain electrodes;

a second conductive connection interconnecting said gate electrodes.

20. An array as defined in claim 19 wherein said cells are located adjacent one another in a first direction whereby said source electrodes are aligned in a single row, said first conductive connection comprising a connection between drain electrodes of adjacent cells at their common end points, and said second conductive connection comprising an elongated connection interconnecting gate electrodes of each cell.

21. An array as defined in claim 20 wherein said second conductive connection further comprises an interconnection between gate fingers of adjacent cells that are aligned in said first direction.

22. An array as defined in claim 19 wherein said cells are located adjacent one another in a second direction whereby said source electrodes are aligned in two rows, said first conductive connection comprising a connection between drain electrodes of adjacent cells along their common length, and said second conductive connection comprising a connection interconnecting adjacent gate electrodes at their common end points.

23. An array as defined in claim 19 including at least four of said cells wherein two of said cells are located adjacent one another in a first direction whereby said source electrodes are aligned in two rows, said first conductive connection comprising a connection between drain electrodes of adjacent cells at their common end points, and said second conductive connection comprising an elongated connection interconnecting gate electrodes of each cell, and wherein two of said cells are located adjacent one another in a second direction whereby said source electrodes are aligned in two rows, said first conductive connection comprising a connection between drain electrodes of adjacent cells along their common length, and said second conductive connection comprising a connection interconnecting adjacent gate electrodes at their common end points.

24. An array as defined in claim 19 wherein each cell of said transistors further comprises:

each of said pair of source electrodes having a generally flat rectangular shape with its length being generally parallel to the direction of gate finger portions, and having a relatively large opening therein;

each of said gate electrodes having a gate pad located at a first side of said one surface, a manifold portion extending generally between said pair of source electrodes and gate finger portions extending from said manifold portion on opposite sides of each of said source electrodes between said source electrodes and said drain electrode;

each of said drain electrode having a drain pad portion located at a second side of said one surface generally opposite said first side and between said pair of source electrodes, a first extension portion located adjacent to each of said source electrodes and also to adjacent gate finger portions and extending away from said drain pad portion a distance generally coextensive with the length of adjacent gate finger portions, a second extension portion located adjacent to each of said source electrodes and also to adjacent gate finger portions on opposite sides of said source electrodes from said first extension portion, said second extension portion being generally coextensive with said first extension portion and an air bridge portion extending from said first extension portion to said second extension portion.

25. An array as defined in claim 24 wherein said air bridge portion is out of contact with said source electrode but substantially overlies said gate finger portions.

26. An array as defined in claim 25 wherein said gate finger portions extend from said manifold portion to a predetermined location relative to the length of each of said source electrodes.

27. An array as defined in claim 26 wherein said predetermined location is generally coextensive with the full length of each of said source electrodes.

28. An array as defined in claim 26 wherein said predetermined location is generally about one half of the full length of each of said source electrodes.

29. An array as defined in claim 24 wherein said opening is generally oval shaped and said substrate means includes a generally same sized and shaped coextensive opening extending therethrough, said source electrode being electrically connected by a layer of conductive material being located on the side walls of said source electrode opening and said substrate opening and extending to said common conductor.

30. A field effect transistor comprising:

substrate means including a body of semiconductor material having an active region on one surface thereof, and a common conductor located in remote insulated relation to said one surface of said semiconductor body;

source electrode means, drain electrode means and gate electrode means located on said one surface;

said source electrode means having a generally rectangular shape with opposed side edges;

said drain electrode means having a drain finger portion located adjacent but spaced from each side edge of said source electrode means;

said gate electrode means having a manifold extending generally between said side edges of said source electrode means, and having an even number of elongated gate finger portions, each of which extend from said manifold between one of said drain electrode drain finger portions and one of said adjacent side edges of said source electrode means; and, at least one conductive connection between said source electrode means and said common conductor.

31. A field effect transistor as defined in claim 30 wherein said drain electrode means further includes an air bridge portion overlying said source electrode means and interconnecting said drain finger portions.

* * * * *